United States Patent [19]
Bencivenga

[11] Patent Number: 6,065,145
[45] Date of Patent: May 16, 2000

[54] METHOD FOR TESTING PATH DELAY FAULTS IN SEQUENTIAL LOGIC CIRCUITS

[75] Inventor: Robert Bencivenga, Branchburg, N.J.

[73] Assignee: Lucent Technologies, Inc., Murray Hill, N.J.

[21] Appl. No.: 09/058,839

[22] Filed: Apr. 13, 1998

[51] Int. Cl.[7] .............................. G01R 31/28; G06F 11/00
[52] U.S. Cl. .......................... 714/724; 714/726; 714/736; 714/815
[58] Field of Search ................................ 714/30, 33, 703, 714/724, 725, 726, 727, 729, 731, 735, 736, 744, 738, 815; 708/254

[56] References Cited

U.S. PATENT DOCUMENTS

| | | | |
|---|---|---|---|
| 5,365,528 | 11/1994 | Agrawal et al. | 714/736 |
| 5,761,215 | 6/1998 | McCarthy et al. | 714/726 |
| 5,889,788 | 3/1999 | Pressly et al. | 714/726 |
| 5,910,958 | 6/1999 | Jay et al. | 714/738 |

*Primary Examiner*—Emmanuel L. Moise

[57] ABSTRACT

The present invention provides a method for generating a path delay fault test for sequential logic circuits along a desired signal path implementing a two rated speed clocking scheme. Although initialization is accomplished at a reduced clock speed, two functional clock cycles are required to fully activate the desired signal transition along the selected signal path lying between designated source and destination flip-flops. Importantly, prior to the second functional clock cycle that activates the signal transition, a first functional clock cycle attempted at the rated clock speed is used to initialize at least the source flip-flop. In so doing, the automatic test equipment (ATE) that applies the test vectors is allowed to ramp-up to the rated clock speed prior to having to critically apply at the rated speed the required test vectors so as to launch the desired signal transition.

27 Claims, 10 Drawing Sheets

RAMP-UP CLOCK PHASE

METHOD FOR TESTING PATH DELAY FAULTS IN SEQUENTIAL LOGIC CIRCUITS

TECHNICAL FIELD

The present invention relates generally to the testing of digital components and, more particularly, to the testing of high speed digital circuits for delay faults along a signal path or paths.

BACKGROUND OF THE INVENTION

Today's digital electronic circuits typically contain combinational elements as well as one or more sequential devices, such as flip-flops. Moreover, such digital electronic circuits operate by propagating digital signals along signal paths between those combinational elements and sequential devices during the period between successive clock cycles. The failure of a signal, however, to propagate along one or more such signal paths during a clock period or cycle usually gives rise to an error known as a "delay fault."

In the past, delay faults have normally been detected using traditional test methodologies, such as a "stuck-at-fault" test and/or functional test(s). The stuck-at-fault test applies stimuli to the primary inputs of the circuit so as to excite a known response at the node or site of the suspected fault. Should the response differ from the expected response, then a so-called "stuck-at-fault" exists. For example, if a "stuck-at-zero" fault is present, a logic "0" is still observed at the selected node or site, even though a test vector is applied that under normal operating conditions would cause a logic "1" to be present at the node.

Another traditional test methodology for detecting a delay fault is to perform at the rated speed of the circuit a so-called functional test(s). Problems with this test methodology, however, include the use of higher cost automatic test equipment (ATE) supporting multiple-pin functional testing that operates at the rated speed of the circuit. While this test methodology may be useful for detecting some delay faults, it is not, however, well-suited to ensure the testing of critical timing paths which are of primary concern during the operation of the circuit.

Various attempts have been made to establish a more reliable as well as a better suited test methodology for detecting delay faults. One such attempt involves the application of two test vector sets or patterns. The first test vector set applies initialization values to setup the logic values along the selected path necessary to propagate a desired logic transition. The second test vector set then propagates the desired logic transition along the selected path to either a primary output or latch, thereby activating the delay fault. The delay fault effect is then propagated to an observable output. Delay faults can be detected by determining whether the desired logic transition has been propagated from the input latch to the output latch within a predetermined interval. This test methodology is sometimes called a "two-pattern test," and requires that two test vector sets be applied at the rated speed of the circuit.

Today's digital electronic circuits, however, exceed operating speeds of, for example, 100 MHZ. While the above mentioned delay fault test methodology may be implemented with the latest automatic test equipment (ATE) that offer multiple-pin electronics, in many instances the rated operating speed of the circuit will exceed the capability of the ATE. Although testing can indeed be performed at a lower speed, it does not guarantee that the circuit will operate properly at the rated clock speed. One proposed solution is to vary the clock frequency of the circuit during the propagation of the first and second test vector sets. More specifically, the circuit only operates at the rated speed when the desired logic transition is propagated along the desired path to the destination latch or flip-flop. When the desired node or site is initialized with the desired logic values as well as when the captured logic transition is propagated to the primary outputs, the clock is run at a slower frequency or speed. See, U.S. Pat. No. 5,365,528 entitled "Method For Testing Delay Faults in Non-Scan Sequential Circuits," issued to Agrawal et al.; and Chakraborty et al., "Delay Fault Models and Test Generation for Random Logic Sequential Circuits," 29th ACM/IEEE Design Automation Conference (1992), paper no. 10.2, pp 165–72, which are incorporated herein by reference.

This latter solution has been widely accepted and, indeed, has even been used with digital circuits implementing so-called "scan circuitry" to increase its effectiveness. See, for example, Chakraborty et al., "Design For Testability for Path Delay Faults in Sequential Circuits," 30th ACM/IEEE Design Automation Conference (1993), pp. 453–57. Unfortunately, however, some older and/or less expensive automatic test equipment (ATE) may still be unable to apply test vector sets at the slower clock speed and then within the next clock cycle reliably apply test vector sets at the rated clock speed.

Accordingly, what is needed is a cost-effective technique for testing sequential digital circuits for delay faults which lies within the capabilities of older as well as less expensive automatic test equipment (ATE).

SUMMARY OF THE INVENTION

The present invention provides a methodology for testing sequential digital logic circuits for delay faults along a desired signal path implementing a novel clocking scheme. The novel clocking scheme uses two functional clock cycles to activate the desired signal transition along the selected signal path lying between designated source and destination flip-flops. This clock scheme obviates the need for the automatic test equipment (ATE) to reliably jump to the rated clock speed in a single clock period. The first functional clock cycle, the speed of which is non-critical, allows the ATE to "ramp-up" to the rated clock speed for the proper activation of the signal transition. That is, if the first functional clock cycle is not able to timely reach the desired rated clock speed in a single clock cycle due to hardware limitations, the second functional clock cycle will have had time to do so, allowing the required transition to be capture so as to properly detect a delay fault.

In one embodiment, the methodology is applied to sequential circuits modified to include "scan" logic structures to ease circuit initialization and observation. Unlike the prior art, the scan sequential circuit is modeled as a circuit with a sequential depth of one. The clocking scheme uses two functional clock cycles, one attempted at the rated clock speed and the second actually at the rated speed, to initialize, and propagate the desired signal transition along the selected path from the designated source flip-flop to the designated destination flip-flop for signal capture.

More specifically, the methodology first consists of initializing source flip-flops as well as those driving the designated destination flip-flop. During this scan initialization, logic values required to propagate the desired signal transition are scan shifted in from the primary inputs of the circuit using a series of reduced speed clock cycles. With the circuit then placed in a functional mode, a first functional clock cycle is applied so as to capture into the source flip-flops the proper logic values required to propagate the signal transition from the designated source flip-flop to the designated destination flip-flop along the selected path. This first functional clock cycle, however, is attempted at the rated speed. "Attempted" is key since it may not be possible for the ATE's pin electronics to jump from a slower "scan" mode clock frequency to a rated clock speed in a single clock period, especially for older ATE machines. A second functional clock cycle which has had time to reach the rated clock speed is then applied such that the applied test vectors propagate the desired signal transition to the destination flip-flop. With the circuit again placed in a "scan" mode, a reduced speed clock cycle(s) scan shifts out to the primary outputs the logic value latched in the designated destination flip-flop. By observing whether this latter logic value from the destination flip-flop corresponds to the value originally latched into the designated source flip-flop, a determination can be made whether a delay fault exists along the selected signal path.

BRIEF DESCRIPTION OF THE DRAWINGS

The features and advantages of the present invention will become more readily apparent from the following detailed description of the invention in which like elements are labeled similarly and in which.

DETAILED DESCRIPTION

The present invention provides a method for testing sequential logic circuits for delay faults along a desired signal path implementing a two rated speed clocking scheme. Although initialization is accomplished at a reduced clock speed, two functional clock cycles, the first attempted at the rated speed and the second at the rated speed, are required to fully activate the desired signal transition along the selected signal path lying between designated source and destination flip-flops. Importantly, prior to the second functional clock cycle that activates the signal transition, the first functional clock cycle, attempted at the rated clock speed, is used to initialize the source flip-flops (SRC_FFs). In so doing, the automatic test equipment (ATE) that applies the test vectors is allowed, if necessary, to "ramp-up" to the rated clock speed prior to having to critically apply at the rated speed the required test sequence that launches the signal transition.

Without any loss of generality or applicability for the principles of the present invention, the embodiment herein is directed to scan combinational digital circuits. It should be clearly understood, however, that the present delay fault test methodology is equally applicable to non-scan digital circuits.

Figure 1:
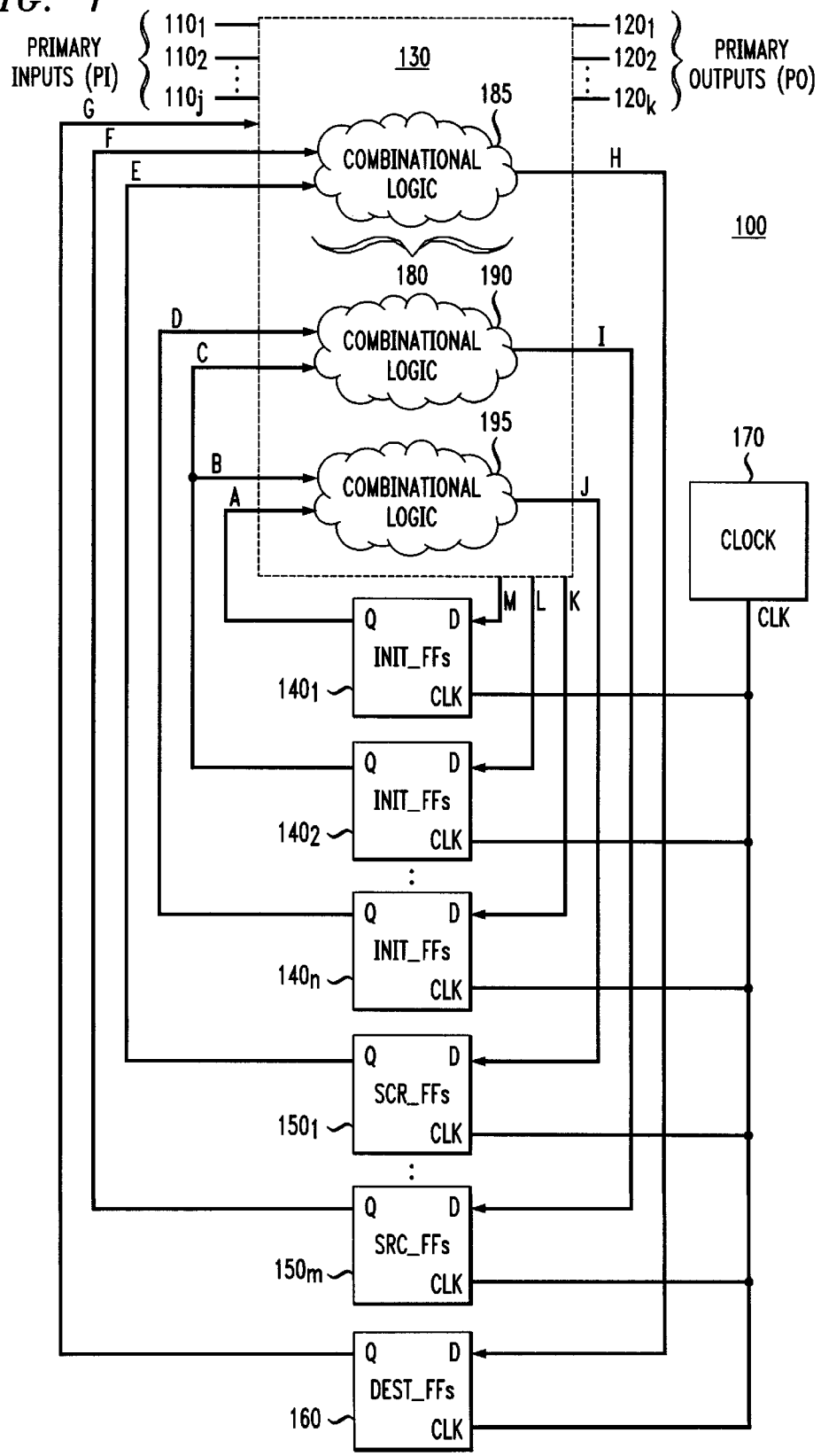
FIG. 1 is a canonical representation of an illustrative scan combinational digital circuit having a signal path along which delay faults are to be detected in accordance with the principles of the invention.

Shown in FIG. 1 is an exemplary model for a digital circuit 100 having primary inputs $110_1$–$110_j$ (collectively referred to herein as "PI") and primary outputs $120_1$–$120_k$ (collectively referred to herein as "PO"), included herein to provide a better understanding of the present invention. Digital circuit 100 is designed to include scan circuitry used for implementing so-called "scan" testing, which is well known to those skilled in the art. See, for example, U.S. Pat. No. 4,534,028 which is incorporated herein by reference. This scan circuitry eases circuit initialization and observation. As such, it should be clearly understood that the initialization and propagation phases of the present invention are effected through the use of scan testing, as discussed more fully herein below.

More particularly, scan testing enables externally generated control signals to switch digital circuit 100 from a "functional" or "normal" mode into a "scan" or. "test" mode. In the scan mode, some or all of the memory elements of the circuit are disconnected from the remaining logic elements and reconfigured into shift registers, each associated with different nodes of the circuit. With all the memory elements reconfigured as shift registers, the testing is so called "full scan" testing. With less than all memory elements reconfigured, the testing is called "partial" or "incomplete" scan testing. In either case, the circuit is placed briefly into the functional mode so that the circuit may react to the presence of test data or vectors applied at the primary inputs of the circuit. Then in the scan mode, the state values of the shift registers may be read or scanned out to the primary outputs, thereby allowing physically inaccessible nodes to be observed. Likewise, state values may also be written or scanned into the nodes.

In its illustrative canonical representation, digital circuit 100 comprises a combinational logic 130 connected between initialization flip-flops $140_1$–$140_n$ (INIT_FFs), source flip-flops $150_1$–$150_m$ (SRC_FFs), and destination flip-flop 160 (DEST_FF). Initialization, source, and destination flip-flops $140_1$–$140_n$, $150_1$–$150_m$ and 160, respectively, are scan type flip-flops. The operation of scan type flip-flops is well known in the art, and for the sake of clarity is not discussed in detail herein. When digital circuit 100, however, is switched into its scan mode, specific logic values may be scanned in and out of the flip-flops. For example, in the scan mode, each flip-flop is made insensitive to the input states appearing at their D inputs from the combinational logic. And, at the same time, the D input of each flip-flop is enabled so as to respond to the Q output of the preceding flip-flop to reconfigure the flip-flops into a scan chain.

Combination logic 130 may itself include combinational logic having logic elements, such as NAND, AND, OR, and XOR gates, depending on the function of the combinational logic. The number and/or type of combinational elements, however, is neither critical to the understanding of nor the operation of the invention. The elements within combinational logic 130 together with initialization, source, and destination flip-flops $140_1$–$140_n$, $150_1$–$150_m$, and 160, respectively, are, however, clocked by signals from a single clock 170.

In accordance with the principles of the invention, the delay fault test methodology involves the propagation of a signal transition along the desired signal path from a designated source flip-flop (SRC_FF) to a designated destination flip-flop (DEST_FF). Referring to FIG. 1, here the designated source flip-flop (SRC_FF) is source flip-flop (SRC_FF) 150 and the designated destination flip-flop (DEST_F) is destination flip-flop (DEST_FF) 160. Signal path 180 is illustratively represented herein as a signal path through combinational logic 185. Specific values that activate a desired signal path have been described, for example, in the paper by C. J. Lin et al., entitled "On Delay Fault Testing In Logic Circuits," *IEEE Transactions On CAD,* Vol. CAD-6, pp. 694–701 (September 1987), which is incorporated herein by reference. Moreover, between initialization flip-flops (INIT_FFs) $140_1$–$140_n$ and source flip-flops (SRC_FFs) $150_1$–$150_m$ are, for example, combinational logic 190 and 195.

It should be clearly understood that the logic values at primary outputs $120_1$–$120_k$ (PO) are determined by the current logic values of primary inputs $110_1$–$110_j$ (PI) and the state value at the previous time frame of initialization, source, and destination flip-flops $140_1$–$140_n$, $150_1$–$150_m$ and 160, respectively. The previous state values of initialization, source, and destination flip-flops $140_1$–$140_n$, $150_1$–$150_m$ and 160, respectively, are fed into combinational logic 130 at inputs A–G, with the current state values appearing at outputs H–M which are to be fed to the inputs of initialization, source and destination flip-flops $140_1$–$140_n$, $150_1$–$150_m$, and 160, as illustrated. The flip-flops are clocked in the following time frame and new values appear at inputs A–G of combinational logic 130.

The delay fault test algorithm of the present invention requires three distinct phases; an initialization, activation and propagation phase, discussed more fully herein below. During initialization, initialization flip-flops (INIT_FFs) $140_1$–$140_n$, as well as combinational logic 190 and 195 are initialized with the proper logic values required for source flip-flop (SRC_FF) $150_1$ or the source flip-flop associated with the signal path under test to propagate the desired signal transition to the destination flip-flop (DEST_FF), here destination flip-flop 160. This initialization is effected via a scan shift operation using reduced speed clock cycles. Upon initialization, two functional clock cycles are used to activate the desired signal transition from source flip-flop (SRC_FF) $150_1$ to destination flip-flop (DEST_FF) 160.

First, a "ramp-up" functional clock cycle is applied to latch the desired logic value into source flip-flop (SRC_FF) $150_1$. That is, designated source flip-flop (SRC_FF) $150_1$ is latched with the desired logic value when digital circuit 100 is placed in the functional mode and attempted to run at the rated clock speed. Then, a second functional clock cycle is used while test vectors are applied to the primary inputs of the digital circuit so as to propagate the desired signal transition to destination flip-flop (DEST_FF) 160. If a delay fault exists along designated signal path 180, an incorrect logic value will be latched into destination flip-flop (DEST_FE) 160, which may then be observed at primary outputs $120_1$–$120_k$ (PO) by shifting out the captured logic value using a series of reduced speed clock cycles. This latter phase is the so-called "propagation" phase of the present delay fault test method.

Advantageously, using two functional clock cycles to activate the signal transition obviates the need for the automatic test equipment (ATE) to reliably jump to the rated clock speed in a single clock period or cycle. The first functional clock cycle, the speed of which is non-critical, allows the ATE to "ramp up" to the rated clock speed for the proper activation of the signal transition. If the first functional clock cycle is not able to timely reach the desired rated clock speed due to hardware limitations of the ATE and/or because of the hardware limitations in the actual circuit, the ATE will be able to run the second functional clock cycle at the rated speed. The second clock functional clock period provides the critical clock cycle applied at the rated clock speed to catch the required transition for detecting a delay fault.

By way of iteration, the application of two functional clock cycles is needed to activate the signal transition between source flip-flop (SRC_FF) $150_1$ and destination flip-flop (DEST_FF) 160. This may be better understood by referring to FIG. 2, which depicts a so-called "iterative logic array model" for the delay fault generation of the present invention along signal path 180. Each copy of digital sequential circuit 100 (excluding the initialization, source and destination flip-flops) is labeled with numeral 100' and represents the behavior of the circuit during a successive time frame or clock period. The time frame for each copy is represented by $T_i$, where i represents the time frame number. Similarly, the primary inputs and primary outputs of the digital circuit at each time frame are represented by PI and PO, respectively. Initialization, source and destination flip-flops $140_1$, $150_1$ and 160 are represented by boxes labeled "INIT" "SRC" and "DEST," respectively. The state values of these flip-flops are fed into the combinational copy of digital circuit 100 at a subsequent time frame.

Figure 2:
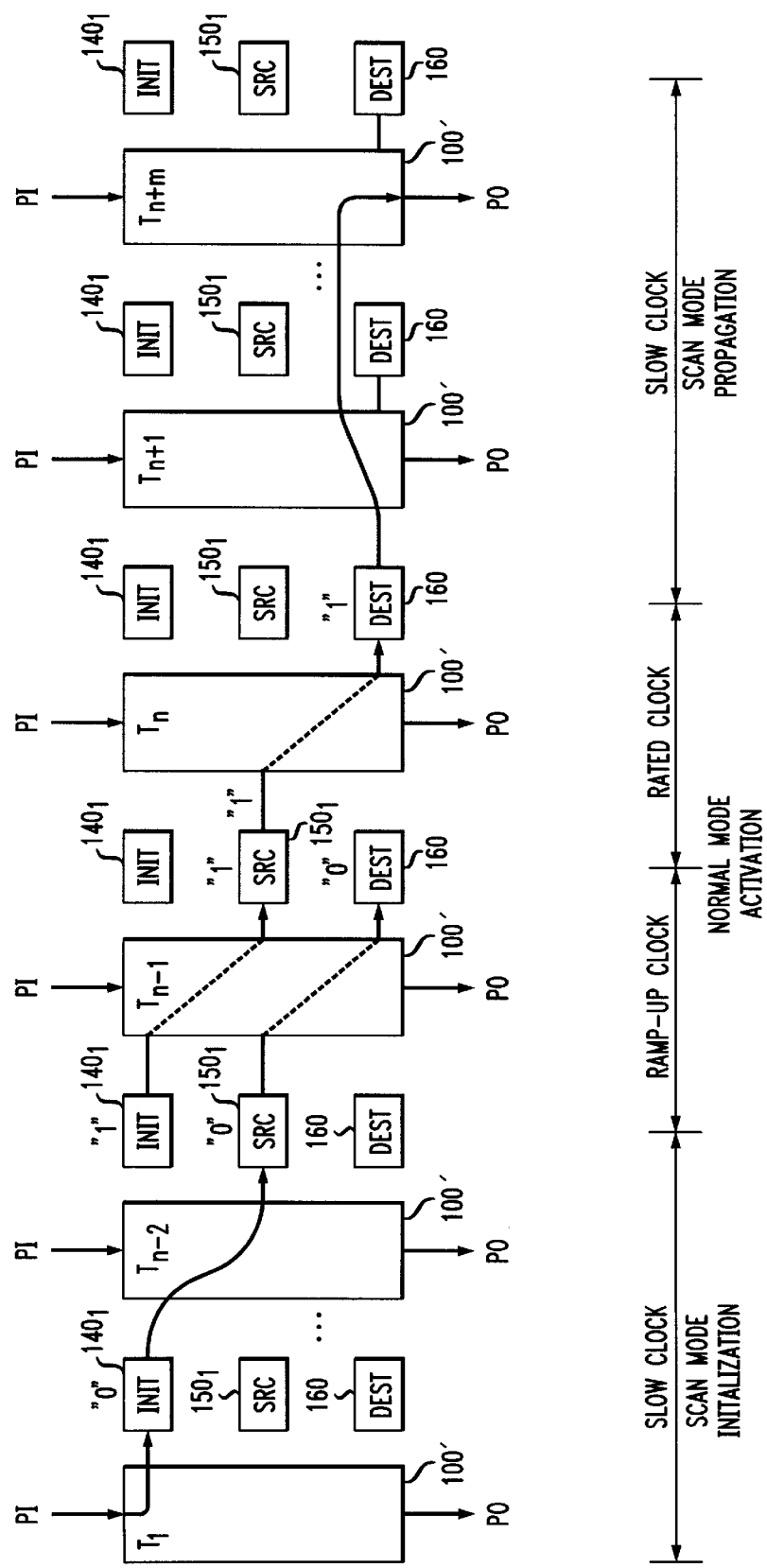
FIG. 2 is an iterative, logic array model for the signal path shown in the combinational digital circuit of FIG. 1 during successive time intervals.

Still referring to FIG. 2, it is assumed that a "0" to "1" (⌐) logic transition is to be propagated from source flip-flop (SRC_FF) $150_1$ to destination flip-flop (DEST_FF) 160 during the time frame $T_n$ for delay fault testing through signal path 180. During the time frames $T_1$ through $T_{n-2}$, the flip-flops are clocked at reduced speed clock cycles via a scan shift operation to initialize source flip-flop (SRC_FF) $150_1$ to a logic "0". Using functional clock cycles at or attempted at the rated speed, the source and destination flip-flops are clocked so that source flip-flop (SRC_FF) $150_1$ produces a logic "0" during the time frame $T_{n-1}$ and a logic "1" during the time frame $T_n$. The logic value "0" produced by source flip-flop (SPC_FF) $150_1$ during interval $T_{n-1}$ is assumed to propagate to destination flip-flop (DEST_FF) 160 by the end of the next time frame.

Of specific interest are time frames $T_{n-1}$ and $T_n$ wherein designated source flip-flop (SRC_FF) $150_1$ transitions from a logic "0" to a logic "1" (⌐) and thereby induces destination flip-flop (DEST_FF) 160 to likewise make the same transition. During the time frame $T_{n-1}$, the clock is attempted to be held at the rated speed to capture a logic "0" into designated source flip-flop (SRC_FF) $150_1$. Then, during the time interval $T_n$, a second functional clock cycle at the rated speed propagates the transition from designated source flip-flop (SRC_FF) $150_1$ to destination flip-flop (DEST_FF) 160. In this way, a delay fault along the selected signal path can be detected by ascertaining whether destination flip-flop (DEST_FF) 160 has undergone that transition within the interval $T_n$. Yet, until the time interval $T_n$, the clock speed is relatively unimportant.

Including an additional clock cycle to activate the transition allows the automatic test equipment (ATE) applying the test vectors to timely ramp up to the rated clock speed at the time interval $T_n$. Keeping the clock speed at the rated speed during the time frames or intervals $T_1$ through $T_{n-2}$ is not viable since that may induce a delay fault in the scan circuitry portion of the circuit, which in turn may interfere with source flip-flop (SRC_FF) $150_1$ undergoing the desired transition during the time frame $T_{n-2}$. For this reason, the speed of the clock is reduced typically to half its normal speed during the time frames or intervals between $T_1$ through $T_{n-2}$.

During the time frame $T_{n+1}$ through $T_{n+m}$, the latched logic value of destination flip-flop (DEST_FF) 160 is scan shifted to the primary outputs, with the speed of the clock again reduced. Again, this is so as to prevent any delay faults in the scan circuitry from adversely affecting the test results.

Figure 3:
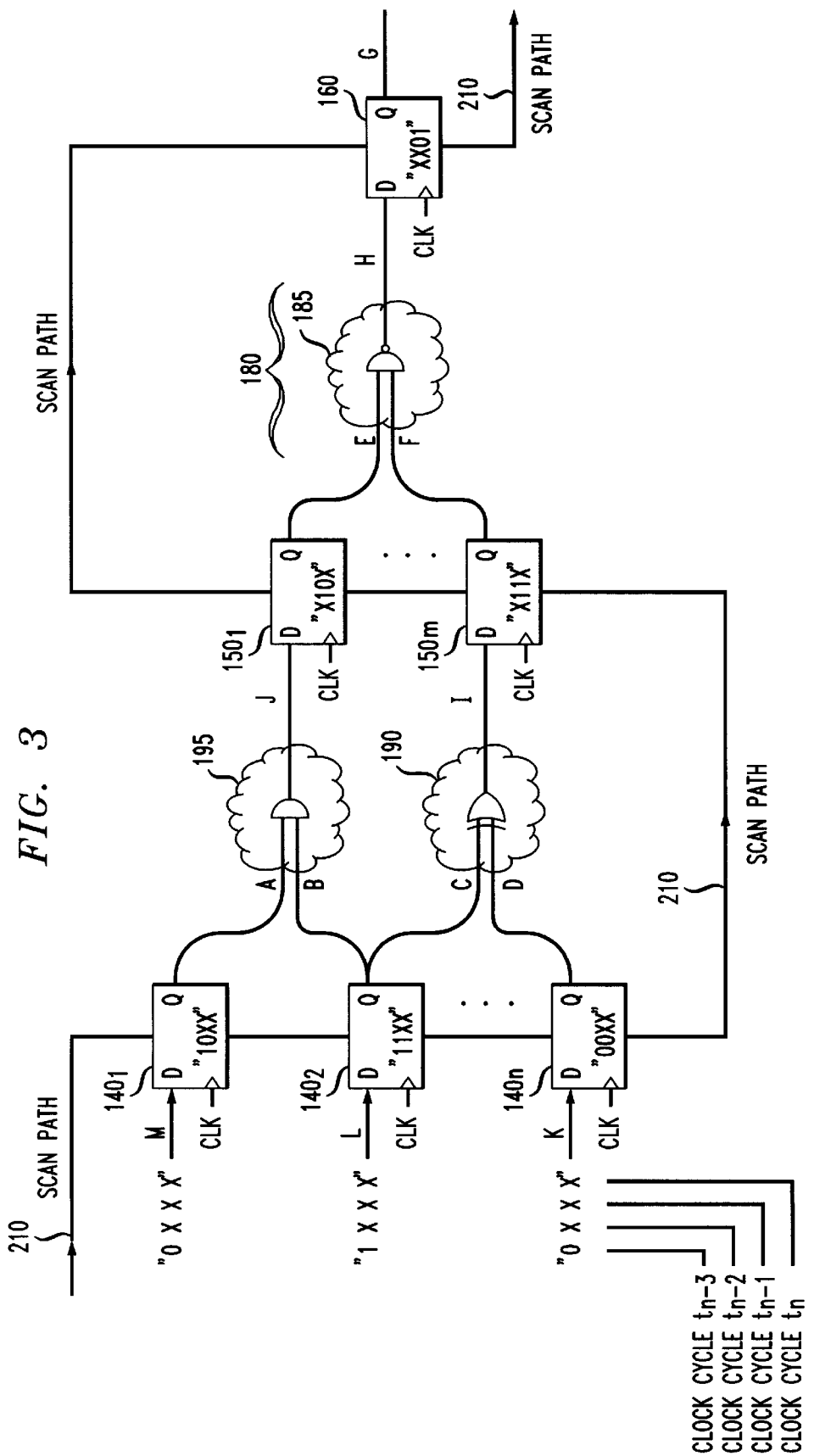
FIGS. 3–8 depict the forward propagation of logic values on a time frame by time frame basis to initialize, activate, and propagate a potential delay fault in accordance with the principles of the invention.

To more fully understand the methodology of the present invention, it would be helpful to examine the propagation of logic values during successive time frames or clock cycles in testing exemplary signal path 180 consisting of known combinational logic elements for a path delay fault. FIG. 3 depicts the set of logic values required to activate and capture a desired "0" to "1" (_⌐) signal transition along signal path 180, whereas FIGS. 4–8 depict in more detail and on a clock cycle by clock cycle basis the logic states of the flip-flops. For illustrative purposes only, combinational logic 185, 190 and 195 herein consist of simple AND, XOR and NAND gates, respectively. Of course, the latter combinational logic could consist of a more complex structure of combinational gates.

For the present circuit, the test methodology of the present invention requires that during clock cycles or time frames $T_{n-2}$ and $T_{n-1}$ a desired signal transition be captured into source flip-flop 150$_1$ (SRC_FF) . And, that the desired signal transition propagates along signal path 180 so as to then be captured into destination flip-flop 160 (DEST_FF) during time frame T. Thereafter, a scan shift out operation makes the logic state content of destination flip-flop 160 (DEST_FF) observable. If the signal transition is late in arriving to the destination flip-flop (DEST_FF) during the application of a clock cycle at time frame $T_n$, an incorrect logic value will be observed.

Specifically identified in FIG. 3 are the logic state values for flip-flops 140$_1$, 140$_2$, 140$_n$, 150$_1$, 150$_m$ and 160, as well the logic values required as inputs thereto after the application of each clock cycle. The notation "0" or "1" has been used to denote a logic "0" or "1", respectively, and the notation "X" has been used to denote a don't care value. Also, a four-string sequence of "0", "1" or "X" has been used to represent the inputs to the flip-flops at the respective time frames $T_{n-3}$ $T_{n-2}$, $T_{n-1}$ and $T_n$. Similarly, the current state values of the flip-flops are represented by a likewise four-string sequence contained within the box denoting the corresponding flip-flop. Also, it should be understood that when the scan mode is active, serial data may be sequentially read in and out of the flip-flops along scan path 210 in a manner well known in the art.

Figure 4:
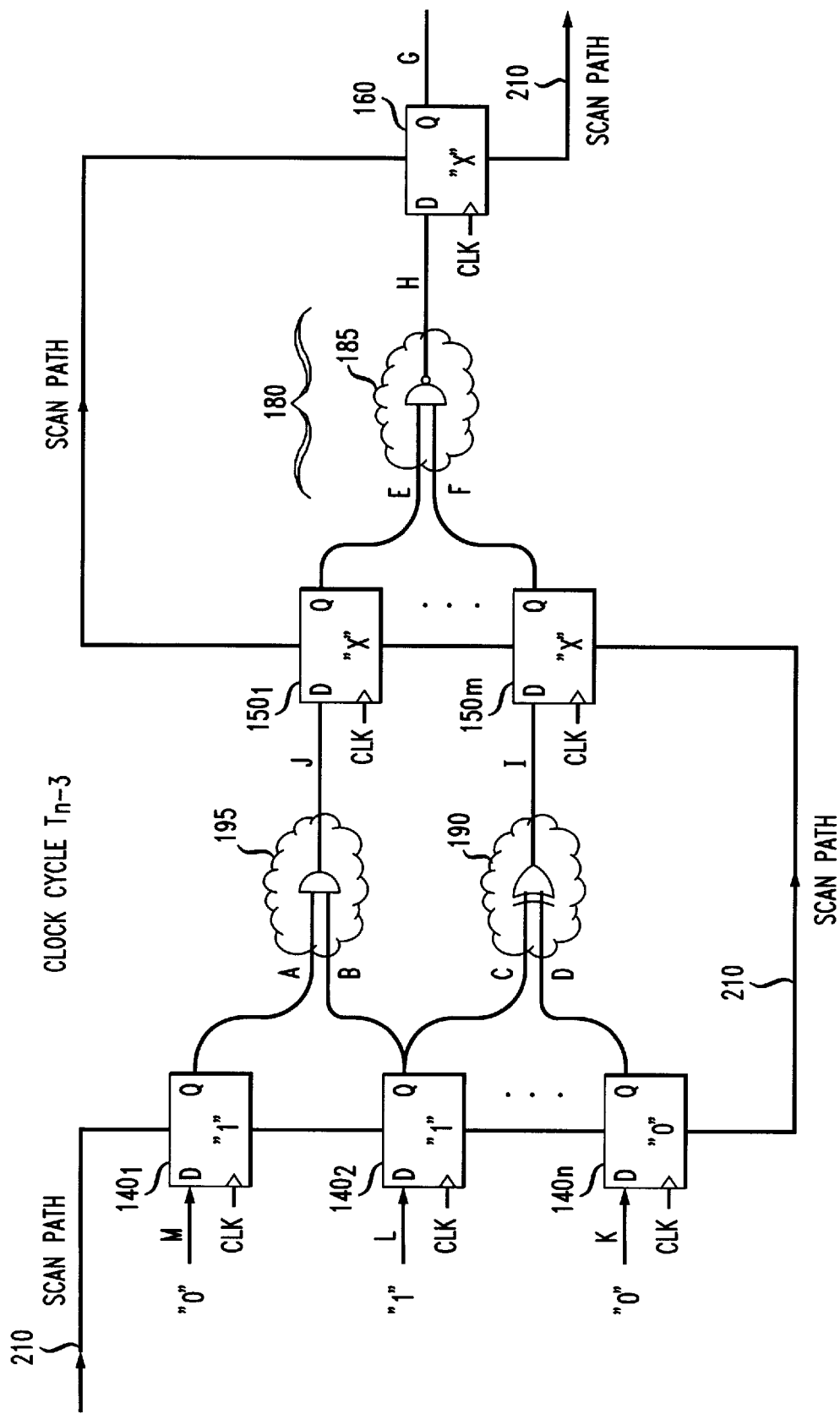

Shown in FIG. 4 are the logic state values at time frame $T_{n-3}$ with digital circuit 100 first placed in its "scan" mode. During this time frame, the required data is scan shifted into initialization flip-flops (INIT_FFs) 140$_1$, 140$_2$ and 140$_n$ for source flip-flop (SRC_FF) 150$_1$ to propagate the desired signal transition along signal path 180 to destination flip-flop (DEST_FF) 160. To do so requires that initialization flip-flops (INIT_FFs) 140$_1$, 140$_2$ and 140$_n$ achieve "1", "1", and "0" logic states, respectively, at the end of the scan shift operation. And, that the inputs feeding into initialization flip-flops (INIT_FFs) 140$_1$, 140$_2$ and 140$_n$ via the non-scan data path have logic values of "0," "1" and "0," respectively. This can be readily accomplished by scan shifting at a reduced clock speed the logic value sequence of "110XXX" along scan path 210, yielding the following results:

| Input Logic Value To | Flip-Flop |
| --- | --- |
| 1 ----------------> | INIT_FF 140$_1$ |
| 1 ----------------> | INIT_FF 140$_2$ |
| 0 ----------------> | INIT_FF 140$_n$ |
| X ----------------> | SRC_FF 150$_m$ |
| X ----------------> | SRC_FF 150$_1$ |
| X ----------------> | DEST_FF 160 |

Since the circuit has been placed in its scan mode, it is not necessary to run the circuit at its rated speed and, as such, is preferably run at half speed. Thereafter, the circuit is switched to its normal functional mode and a clock cycle applied so as to advance the circuit to time frame $T_{n-2}$. This requires that the switch to the circuit's normal mode happens at a speed fast enough for all scan type flip-flops to do likewise so that the rated speed clock cycle can be applied while the circuit is in its functional mode.

Figure 5:
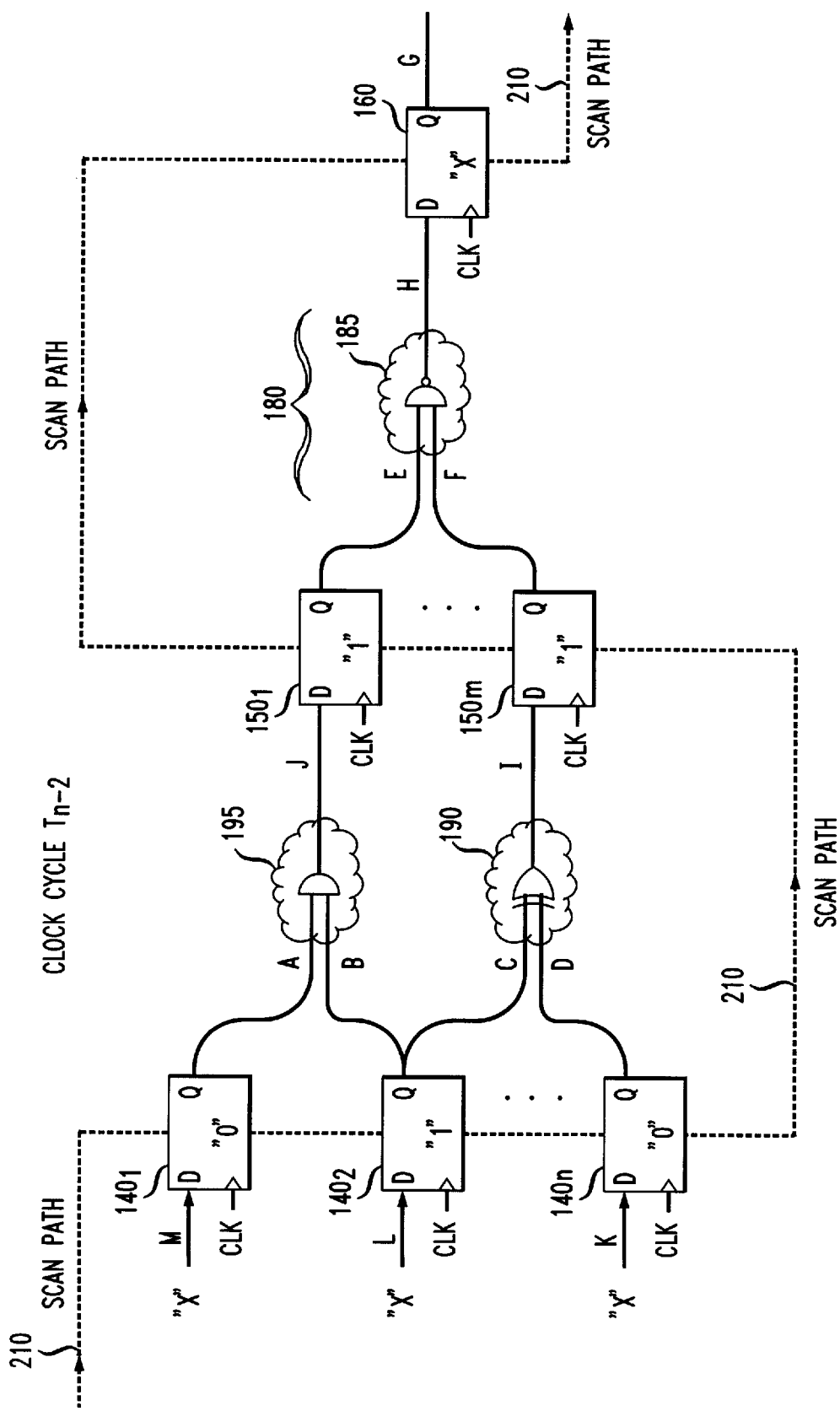

FIG. 5 shows the effects of the application of a clock cycle during time frame $T_{n-2}$. It should be recalled that the circuit is now in its normal functional mode. When clocked, the logic values in initialization flip-flops (INIT_FFs) 140$_1$, 140$_2$, and 140$_n$ propagate through combinational logic 195 and 190, and the outputs thereof propagate to source flip-flops (SRC_FFs) 150$_1$ and 150$_m$. This results in source flip-flops (SRC_FFs) 150$_1$ and 150$_m$ both having a logic value of "1." In addition, the input data set up on the functional data paths feeding initialization flip-flops (INIT_FFs) 140$_1$, 140$_2$, and 140$_n$ are captured.

The applied clock cycle at time frame $T_{n-2}$ is run at a reduced speed since no signal transition occurs along signal path 180 at that time frame. It should be understood that only when capturing a signal transition along the signal path under test does the clock cycle have to be applied at the rated speed of the circuit. In reducing the clock speed, the circuit has some time to switch from its scan mode to its normal functional mode without concerns about race or hazard conditions that may occur during the switch.

Figure 6:
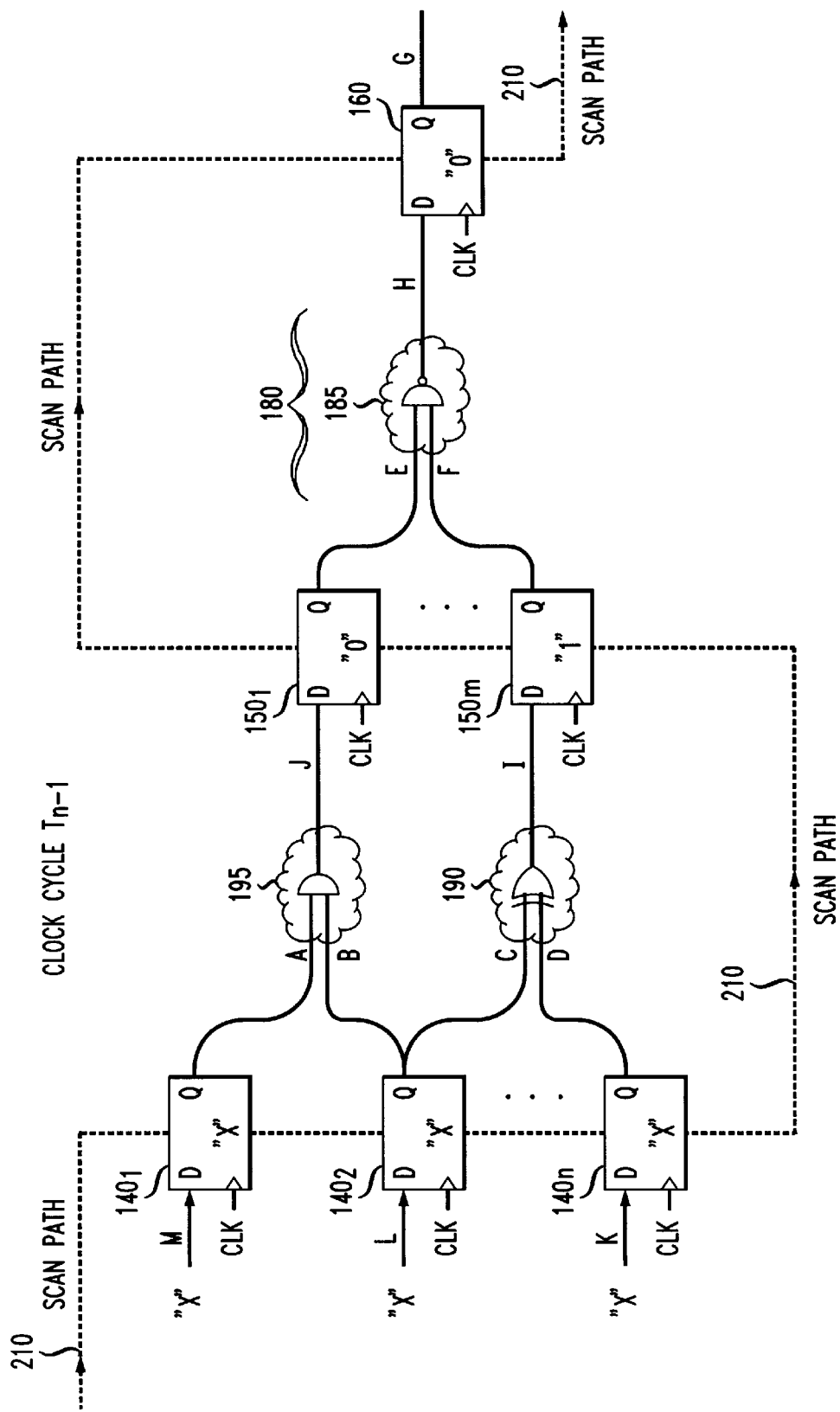

Now referring to FIG. 6, there are shown the effects the application of a clock cycle has during time frame $T_{n-1}$ Specifically, a functional clock cycle attempted at the rated speed is applied so as to latch desired state values into the source and destination flip-flops, here a logic "0" into destination flip-flop (DEST_FF) 160, a logic "0" into source flip-flop (SRC_FF) 150$_1$, and a logic "1" into source flip-flop (SRC_FF) 150$_m$. Whether the clock cycle is actually applied at the rated speed is immaterial since again no signal transition occurs along signal path 180. In so doing, however, the automatic test equipment (ATE) applying the test vectors and clock cycles are allowed to "ramp-up" to the circuit's rated speed so as to ensure that the next clock cycle is actually applied at the rated speed.

Figure 7:
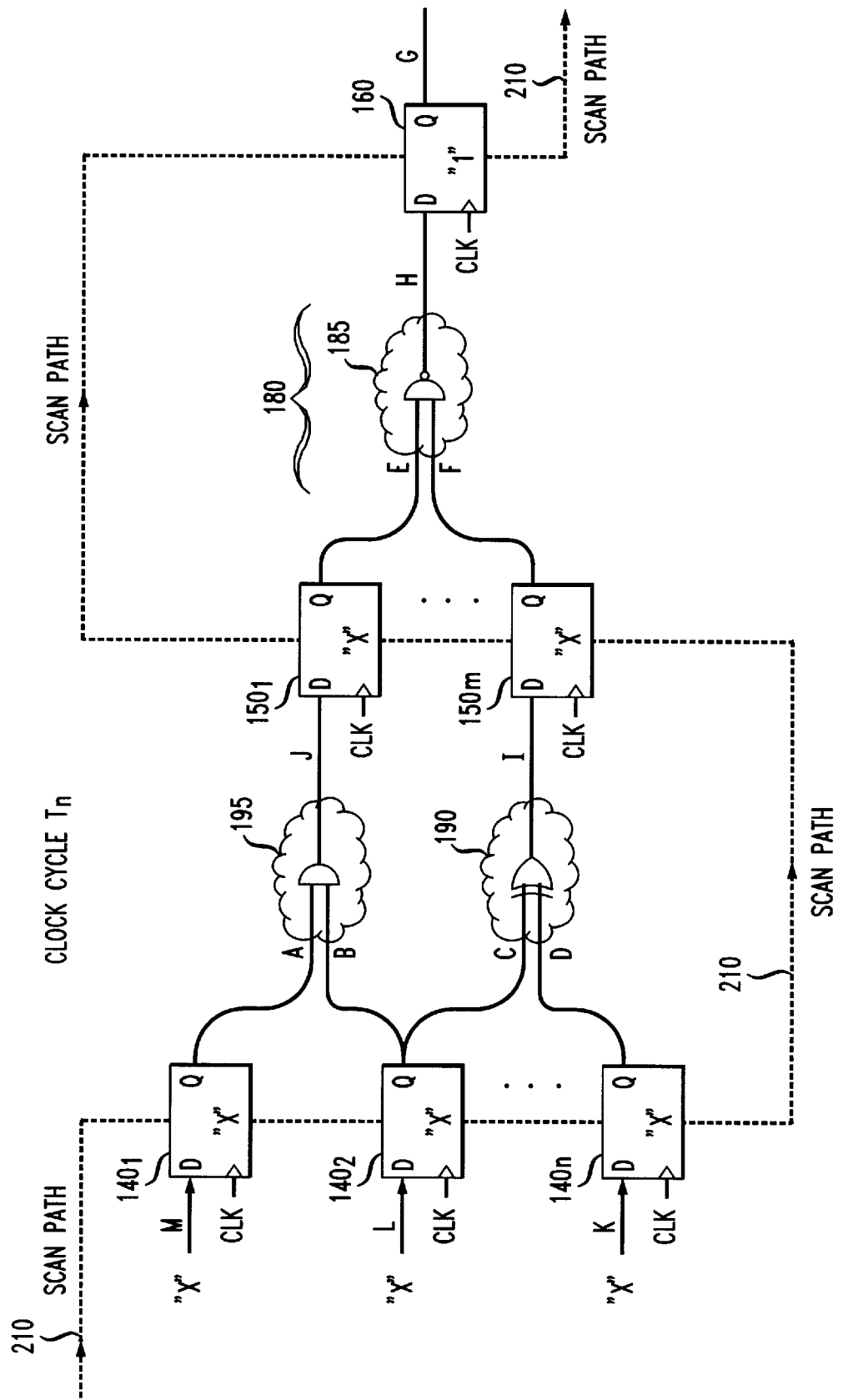

Shown in FIG. 7 is the application of a clock cycle at time frame $T_n$ which propagates the desired signal transition from source flip-flop (SRC_FF) 150$_1$ to destination flip-flop (DEST_FF) 160. More specifically, during this clock period the "0" to "1" (_⌐) transition occurring along signal path 180 is captured into destination flip-flop (DEST_FF) 160 using a second functional clock cycle applied at the rated clock speed. Since this clock cycle is at the rated speed, a late arriving transition will not be captured, which is properly indicative of a path delay fault. Instead, the previous logic state value is captured into destination flip-flop (DEST_FF) 160.

Figure 8:
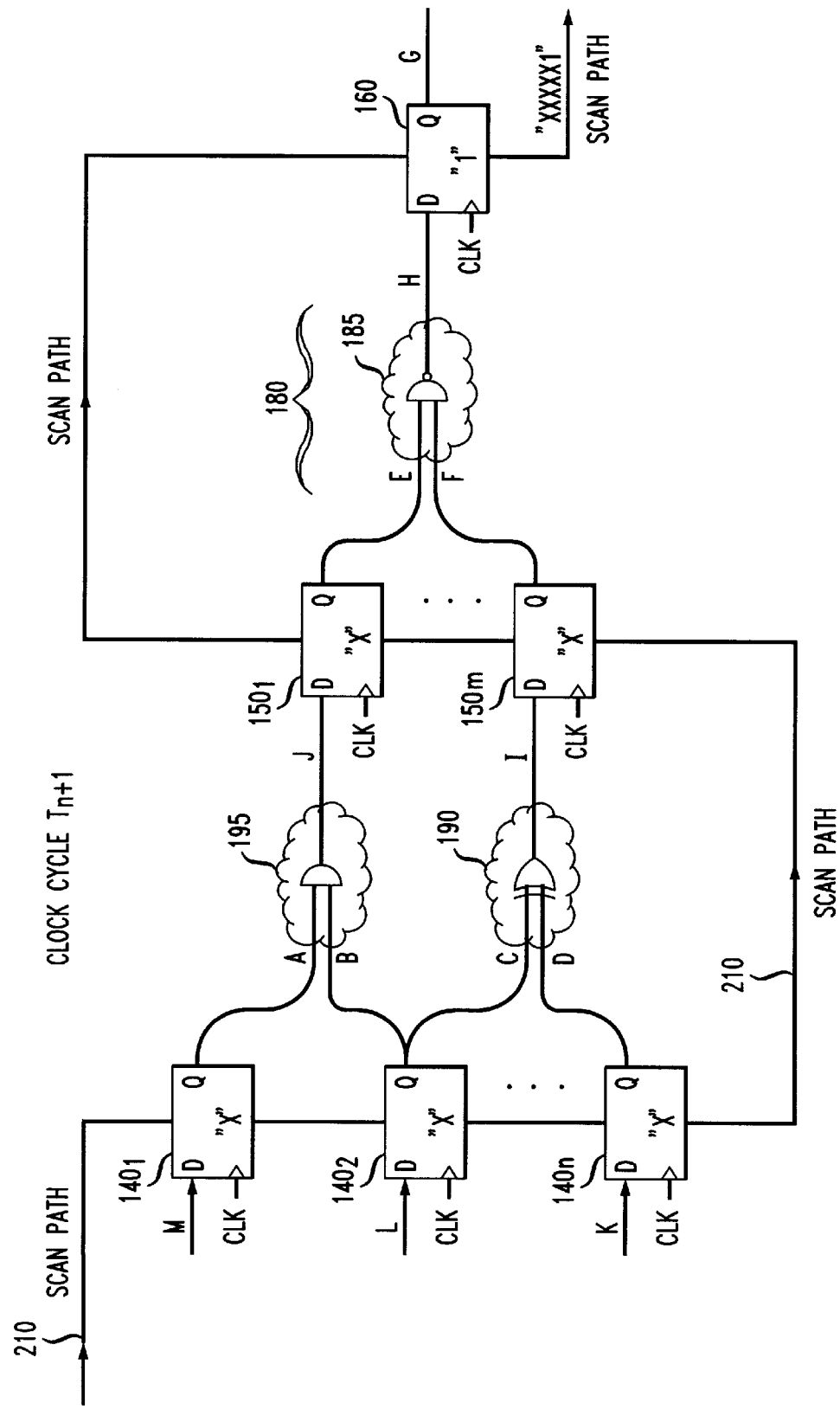

The final logic states of the flip-flops, after the application of the rated clock cycle at time frame $T_{n+1}$, are shown in FIG. 8. The circuit is first switched back to its scan mode. Then, a scan shift out operation is effected using a clock cycle applied at a reduced clock speed so as to observe the logic state value of destination flip-flop (DEST_FF) 160 at the primary outputs of the circuit. If a path delay fault occurred along signal path 180, an incorrect logic value will be observed during the scan shift out operation.

Figure 9:
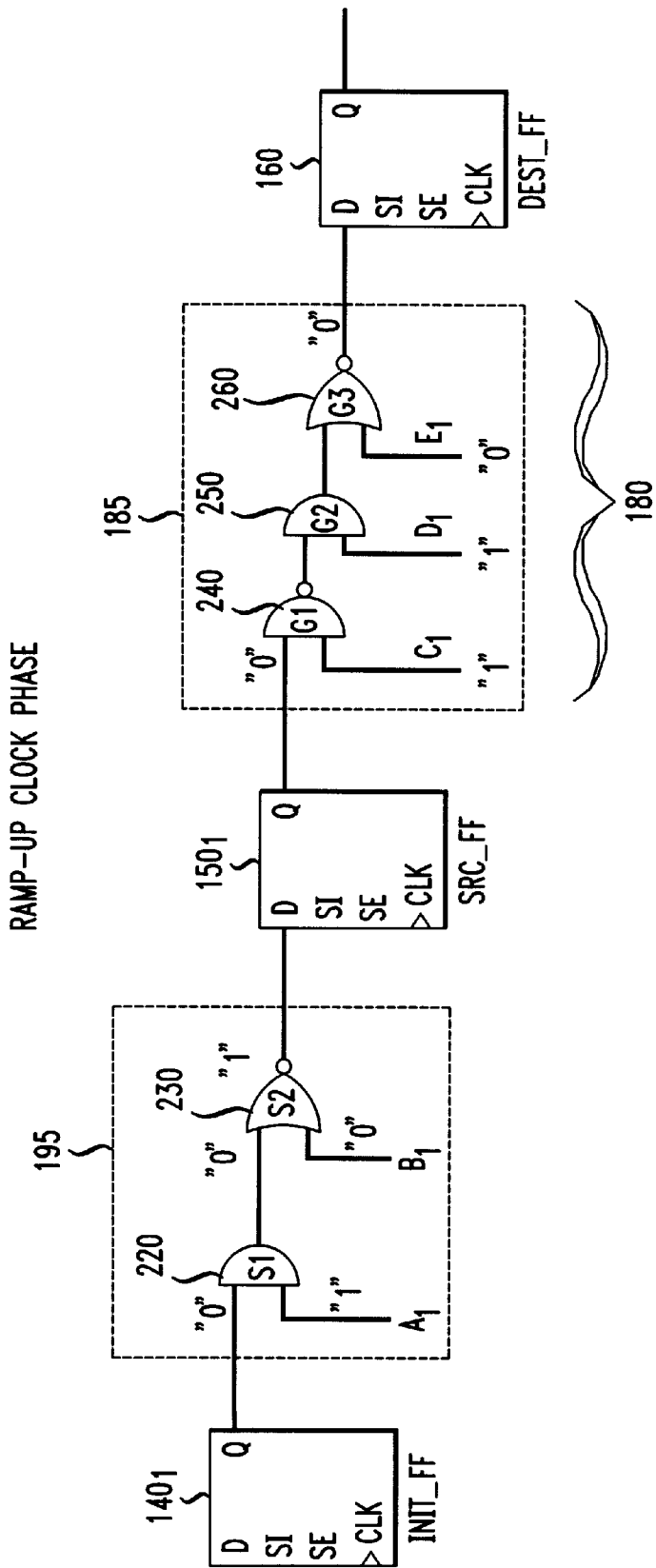
FIGS. 9–10 are illustrative schematic representations for activating a desired logic transition along the desired signal path of the combinational digital circuit of FIG. 1.
Figure 10:
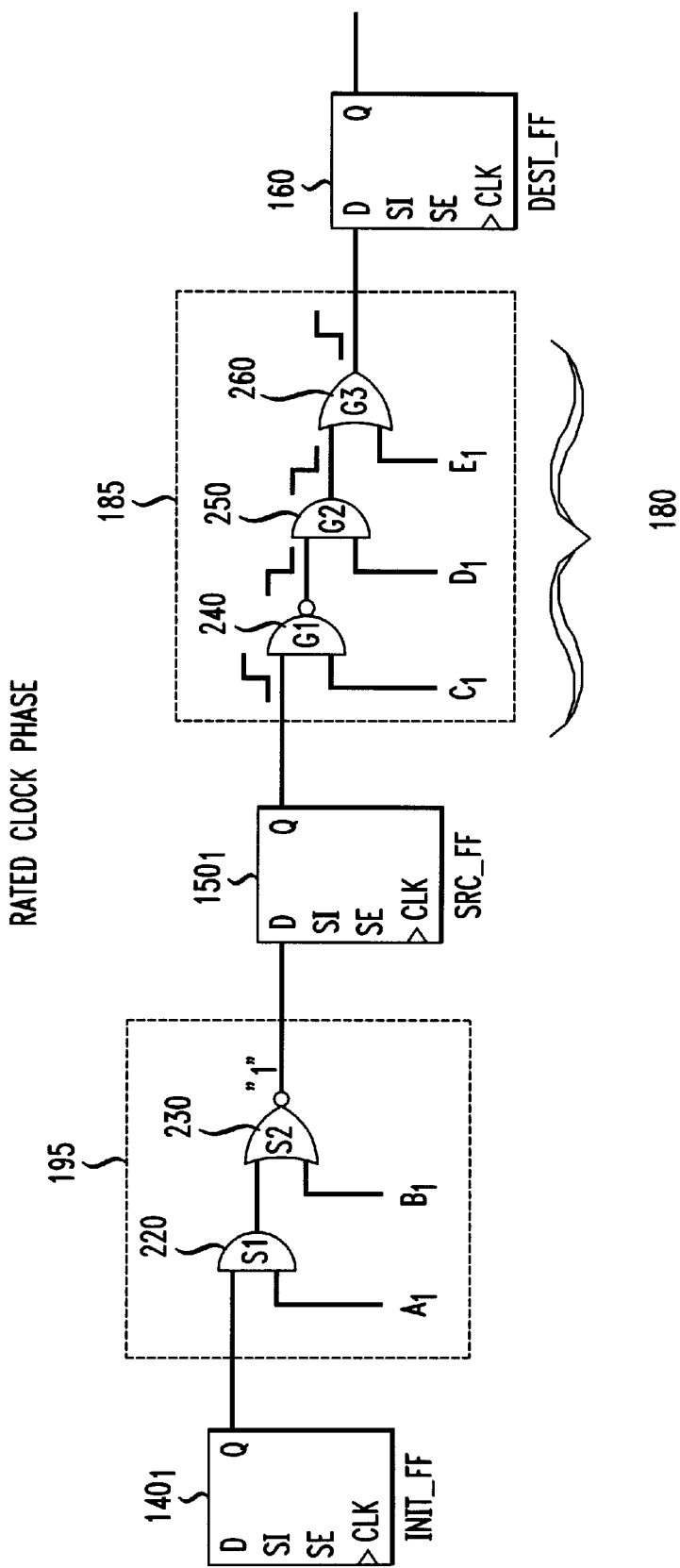

The activation phase of the present delay fault test methodology may be further examined in more detail by illustrating the activation of a desired signal transition along exemplary signal paths 195 and 185 consisting of combinational elements 220 (S1)and 230 (S2), and combinational elements 240 (G1), 250 (G2) and 260 (G3), respectively, as depicted in FIGS. 9 and 10.

Again, it is assumed that a "0" to "1" logic transition ($\_\!\!\lrcorner$) is to be propagated from source flip-flop (SRC_FF) 150$_1$ to destination flip-flop (DEST_FF) 160. And, to do so requires the application of two functional clock cycles. During the first functional clock cycle, source flip-flop (SRC_FF) 150$_1$ is initialized to a logic "0". This can be done in several ways. For example, the Q output of initialization flip-flop (INIT_FF) 140$_1$ Can be set to a logic "1" during initialization, while also simultaneously setting the values on inputs A$_1$ and B$_1$ to "1" and "0,"respectively, via a scan shift operation. Applying the first functional clock cycle attempted at the rated speed captures or latches a logic "0" into source flip-flop (SRC_FF) 150$_1$. Likewise, if inputs C$_1$, D$_1$, and E$_1$ are controlled by flip-flops, the logic values must be set during initialization and then properly captured during the first functional clock cycle of the activation phase. It should be recalled, however, that this functional clock cycle may or may not actually be applied at the rated speed.

With a logic "0" at source flip-flop (SRC_FF) 150$_1$, a backward justification is carried out over several time frames to generate a vector sequence that will propagate the signal transition along selected signal path 180. This is done so as to set the output of gate 230 (S2) to a logic "1," and inputs C$_1$, D$_1$ and E$_1$ of combinational elements 240 (G1), 250 (G2), and 260 (G3) to logic values of "1," "1" and "0," respectively. Applying the second functional clock cycle at the rated clock cycle propagates the desired signal transition to destination flip-flop (DEST_FF) 160, as illustrated in FIG. 10.

Advantageously, the present methodology avoids needless testing if the desired path is functionally unsensitizable, i.e., false path. For example, if the above inputs C$_1$, D$_1$ and E$_1$ were driven by scan flip-flops, then a test structure could be easily generated to reach all $2^4$ possible states via the scan chain. However, during the normal functional operation of the circuit, it may be impossible to reach certain states, called illegal states. Under the present delay fault methodology, attempting to establish a vector sequence to activate the signal transition for such an unsensitizable signal path may not be possible. This is so since such a vector sequence cannot be established to propagate the desired signal transition along the functionally unsensitizable signal path.

Attached hereto as an appendix is an illustrative pseudo-code for a delay fault automatic test generation (ATG) algorithm in accordance with the delay fault test methodology discussed herein above. For each path being tested, its sequential circuit model has a sequential depth of one and is produced using traditional circuit reduction techniques used by ATPG algorithms in full scan circuits. One exception is that all sequential elements that drive logic into the destination flip-flops are considered to be non-scan elements, even though in reality they may be scan-type flip-flops. All other sequential elements are assumed to be scan type elements. In essence, the circuit model is of an almost full scan or partial scan structure.

A brief description of the pseudo-code is set forth herein below. Those skilled in the art are readily familiar with the use of pseudo-code in describing ATG algorithms as well as with the terminology used to describe backward justification. For a detail discussion on backward justification, see the book entitled *Digital Logic and Test Simulation,"* by Alexander Miczo, Harper & Row, pp. 25–28 (1986) and the paper entitled "The Back Algorithm for Sequential Test Generation," by Wu Tung Cheng, Conference Proceedings, *International Conference of Computer Design,* October 1988, Rye, New York, pp. 626–29.

Referring to the pseudo-code, at line (1), the algorithm begins with the selection of a signal path to test. This signal path can be selected using the criterion of the longest delay time, or some other criterion. Once the signal path is chosen, the algorithm at line (2) identifies the source flip-flop (SRC_FF) and destination flip-flop (DEST_FF) for the desired signal path and empties at line (3) a state value objective queue (SV_OBJQ) operating in first-in first-out (FIFO) mode. This objective queue is used to record the circuit state value objectives for generating a test for any particular clock cycle. Next, at line (4), the circuit is placed in its normal mode by placing the non-scan mode setting at the scan-mode primary inputs and performing forward implication of that value through the circuit.

At line (5), a logic value is chosen as the transition value that the DEST_FF is desired to capture during clock cycle T$_n$ and it is added to the objective queue SV_OBJQ for immediate retrieval in line (6) as the current justification value. A backward path justification is performed at line (7) to satisfy propagating the desired logic value along the path under test into the DEST_FF. This is done by setting all the non-path inputs of gates of the signal path under test to their non-dominant logic values. For example, a logic "1" on AND gates, and a logic "0" on OR gates. If the backward path justification of line (7) fails, then the desired signal path cannot be activated with the desired transition and is declared as false at line (8). Otherwise, the requirements of a test vector satisfying the objectives of receiving the transition value set in line (5) have been satisfied. This test vector will be clocked in at line (9) to the primary inputs during clock cycle T$_n$.

At this point, the next clock cycle or time frame identified as T$_{n-1}$ can be processed. This time frame sets the initial value of the transition requirement for the DEST_FF as a state objective at line (10). In addition, additional state requirements that have to be satisfied from the backward path justification of line (7) are executed. These state requirements are those values from the flip-flops used to propagate the transition along the path under test of line (7). Such state requirements are inserted into the state value objective queue at line (11). With all state objectives required for clock cycle T$_{n-1}$ in the queue, an attempt is made at line (12) to satisfy all these state objectives by obtaining a justification value from the queue and doing a backward path justification at line (13).

Again, if the backward path justification fails at line (14), the path is declared as non-sensitizable or false and all further steps terminated. A looping structure is presented at line (15) to take an objective from the state value objective queue at line (15*a*) and perform a backward logic justification so as to satisfy the state value objective of line (15*b*). Failure of line (15*b*) again implies a non-sensitizable path at line (15*c*), which terminates the test. Backward logic justification (different than backward path justification) requires that the state value objective be satisfied via any input combination from flip-flops and/or primary input pins to the circuit. If all state values are satisfied, then the generation of values for time frame T$_{n-1}$ is complete and a test vector is created at line (16) for this clock cycle.

The next time frame, T$_{n-2}$ can now be addressed. First, the state value requirements from all operations of line (15*b*) are added and placed into the queue. Lines (18) and (19) behave similarly to what was described at lines (15) and (16), except that the vector created is for time frame $T_{n-2}$.

Next, the steps required to build the vector sequence for time frame $T_{n-3}$ is addressed. This starts with line (20) which fills the state objective queue with state requirement values from previous justification routines and continues again with a loop structure at line (21) which justifies those state requirements. If the loop structure empties the queue, then all state requirements are satisfied. Also, the final requirement of setting up the scan flip-flops with state values upon the completion of a scan shift in operation must be satisfied. This is done by inserting state requirements for all flip-flops feeding combinational blocks exercised during line (21) into the state objective queue of line (22), and recording the primary input requirements from line (21) at line (23). The circuit can then be placed into its scan mode at line (24) and the state value objectives satisfied at line (25) via a scan chain shift operation that has the last shift operation meeting the state value requirements. At line (26), the scan sequence test vectors can be produced using the primary input values of the non-scan chain and related primary input pins, along with scan primary input pins. Line (27) involves creating a scan out or scan chain flush sequence.

At present, all time frame requirements have been satisfied and a delay fault test can be created to test the selected path, which is done so at lines (28,29,30). In particular, this is done by concatenating the test vectors from lines (26), (19), (16), (9) and (27) and recording in test application notes that clock cycle sequences from lines (16) and (9) are to be run at-speed, while all other sequences are to be run at a reduced clock frequency.

It should be understood that the embodiments herein are merely illustrative of the principles of the invention. Various modifications may be made by those skilled in the art which will embody the principles of the invention and fall within the spirit and the scope thereof. For example, in the embodiment herein above, initialization and propagation may be effected through scan shift operations. For non-scan digital circuits, a backward justification may be carried out to generate test vector sequence which when input to the primary inputs of the circuit causes the proper logic values to be generated at the initialization flip-flop, as well as at the combinational elements within combinational logic 185, 190 and 195. Likewise, a second backward justification can be carried to establish a second vector sequence which when applied to the primary inputs of the circuit will propagate the logic value latched in the destination flip-flop to the primary outputs of the circuit.

APPENDIX

DELAY FAULT AUTOMATIC TEST GENERATION ALGORITHM (ATG):

| | |
|---|---|
| BL_JUST | = Backward Logic Justification |
| J_VAL | = Justification Value |
| BP_JUST | = Backward Path Justification |
| SRC_FF | = Source FF |
| CLB | = Combinational Logic Block |
| SV_OBJQ | = State Value Objective Queue (FIFO) |
| DEST_FF | = Destination FF |
| T_VAL | = Transition Value |
| (1) | Select A Path To Test |
| (2) | Identify SRC_FF And DEST_FF |
| (3) | Empty SV_OBJQ |
| (4) | Put Circuit Into Normal Mode |
| (5) | Choose A T_VAL For DEST_FF And Add It To SV_OBJQ |
| (6) | Get Next J_VAL From SV_OBJQ |
| (7) | Perform BP_JUST Thru CLB From SRC_FF to DEST_FF To Satisfy J_VAL Objective |
| (8) | If BP_JUST Failed Then |
| (8a) | Declare Path As Non-Activatable Path |
| (8b) | Goto (1) Endif |
| (9) | Create Clock Cycle Test Vector For Time n From Logic Value Requirements On primary Input pins |
| (10) | Add Opposite Logic Value Assigned In (5) For DEST FF To SV_OBJQ |
| (11) | Add State Requirements For All FF's Feeding CLBs Exercised From Previous BP_JUST To SV_OBJQ |
| (12) | Get Next J_VAL From SV_OBJQ |
| (13) | Perform BP_JUST Thru CLB From SRC_FF To DEST_FF To Satisfy J_VAL Objective |
| (14) | If BP_JUST Failed Then |
| (14a) | Declare Path As Non-Activatable Path |
| (14b) | Goto (1) Endif |
| (15) | While SV_OBJQ Queue Is Not Empty Do |
| (15a) | Get Next J_VAL From SV_OBJQ |
| (15b) | Perform BL_JUST Thru CLB To Satisfy J_VAL Objective |
| (15c) | If BL_JUST Failed Then |
| (15c1) | Declare Path As Non-activatable Path |
| (15c2) | Goto (1) Endif |

APPENDIX-continued

DELAY FAULT AUTOMATIC TEST GENERATION ALGORITHM (ATG):

|        | Done |
|--------|------|
| (16)   | Create Clock Cycle Test Vector For Time n-1 From Logic Value Requirements On Primary Input Pins |
| (17)   | Add State Requirements For All FF's Feeding CLBs Exercised From Previous BP_JUST And BL_JUST To SV_OBJQ |
| (18)   | While SV_OBJQ Is Not Empty Do |
| (18a)  | Get Next J_VAL From SV_OBJQ |
| (18b)  | Perform BL_JUST Thru CLB Logic To Satisfy J_VAL Objective |
| (18c)  | If BL_JUST Failed Then |
| (18c1) | Declare Path As Non-activatable Path |
| (18c2) | Goto (1) Endif Done |
| (19)   | Create Clock Cycle Test Vector For Time n-2 From Logic Value Requirements On Primary Input Pins |
| (20)   | Add State Requirements For All FF's Feeding CLB Exercised From Previous BL_JUST to SV_OBJQ |
| (21)   | While SV_OBJQ Is Not Empty Do |
| (21a)  | Get Next J_VAL From SV_OBJQ |
| (21b)  | Perform BL_JUST Thru CLB To Satisfy J_VAL Objective |
| (21c)  | If BL_JUST Failed Then |
| (21c1) | Abandon Test Path, Cannot Be Satisfied |
| (21c2) | Goto (1) Endif Done |
| (22)   | Add State Requirements For All FF's Feeding CLB Exercised From BL_JUST To SV_OBJQ |
| (23)   | Record Primary Input Requirement Values |
| (24)   | Put Circuit Into Scan Mode |
| (25)   | Satisfy State Value Objectives Via Scan Chain Shifting |
| (26)   | Create Test Vectors For Scan-in Sequence In |
| (24)   | Using the Primary Input Values of Non Scan Chain Related Primary Input Pins From (22) Along With Scan Primary Input Pins |
| (27)   | Create Test Vectors For Scan-out Sequence |
| (28)   | Create Delay Fault Test Sequence By Concatenating Test Vectors From (26), (19), (16), (9) & and (27). |
| (29)   | Record Test Application Notes That Clock Cycle Sequences from (16) & (9) Are To Be Run At-speed, All Other Sequences Are Run At A Reduced Clock Frequency |
| (30)   | Delay Fault Test Generation Successful, For More Paths GoTo (1) |

What is claimed is:

1. A method for testing for a delay fault along a signal path in a sequential circuit having at least one primary input and one primary output, said method comprising the steps of:

initializing logic within the sequential circuit at a reduced clock speed with state values required to propagate a desired signal transition along the signal path of interest;

propagating at the rated clock speed of the circuit said desired signal transition along said signal path of interest; and prior to propagating said desired signal transition, activating at an attempted rated clock speed said desired signal path of interest so as to allow the applied clock cycle to ramp-up to the rated clock speed of the circuit.

2. The method according to claim 1 wherein the step of propagating at the rated clock speed said desired signal transition includes performing a backward path justification for the signal path of interest.

3. The method according to claim 1 further comprising the step of comparing the signal transition propagated along said signal path of interest with said desired signal transition.

4. The method according to claim 1 further comprising the step of propagating out to said at least one primary output the signal transition propagated along said signal path of interest.

5. The method according to claim 1 wherein said desired signal transition propagated along said signal path of interest is propagated out to said at least one primary output at the reduced clock speed.

6. The method according to claim 1 wherein the reduced clock speed is half the speed of the rated clock speed.

7. The method according to claim 1 further comprising the step of checking whether said signal path of interest is sensitizable.

8. The method according to claim 1 wherein said sequential circuit includes a source flip-flop proximate to one end of said signal path of interest and includes a destination flip-flop proximate to another end of said signal path of interest.

9. The method according to claim 1 wherein a test vector sequence is applied to said at least one primary input for propagating said desired signal transition along said signal path of interest.

10. A method for testing for delay faults in a sequential circuit along a signal path of interest lying between a source flip-flop and a destination flip-flop, said method comprising the steps of:

initializing at a reduced clock speed logic within the sequential circuit with state values required to propagate a desired signal transition along the signal path of interest from the source flip-flop to the destination flip-flop;

initializing, attempted at the rated clock speed of the circuit, at least said source flip-flop with a logic value that causes said source flip-flop to generate said desired signal transition; and applying test vectors to the sequential circuit at the rated clock speed so as to propagate said desired signal transition to said destination flip-flop such that a corresponding logic value is latched therein; and comparing the logic value latched into said destination flip-flop to an expected logic value for determining whether a delay fault exists along said signal path of interest.

11. The method according to claim 10 further comprising the step of performing a backward path justification for said signal path of interest.

12. The method according to claim 10 further comprising the step of propagating the logic value latched into said destination flip-flop to said at least one primary output.

13. The method according to claim 12 wherein said logic value latched into said destination flip-flop is propagated out to said at least one primary output at the reduced clock speed.

14. The method according to claim 10 wherein the reduced clock speed is half the speed of the rated clock speed.

15. The method according to claim 10 further comprising the step of checking whether said signal path of interest is sensitizable.

16. A method for detecting for a delay fault along a signal path of interest in a scan sequential digital circuit having primary inputs, primary outputs and a plurality of flip-flops, said method comprising the steps of:

designating a source flip-flop proximate to a first end of the signal path of interest, a destination flip-flop proximate to a second end of the signal path of interest, and an initialization flip-flop extending to said source flip-flop along another signal path;

switching the scan sequential digital circuit into its scan mode;

applying clock cycles at a slow clock speed to initialize via a scan shift operation the initialization flip-flop and logic between the initialization flip-flop and the source flip-flop with state values required for the source flip-flop to propagate a desired signal transition to the destination flip-flop;

switching the scan sequential digital circuit into its functional mode;

applying a first test vector sequence to the primary input attempted at the rated clock speed so as to initialize the source flip-flop, and logic between said source flip-flop and said destination flip-flop, required to propagate said desired signal transition to said destination flip-flop;

applying a second test vector sequence to the primary input at the rated clock speed such that said desired signal transition is propagated to the destination flip-flop such that a logic value is latched therein;

switching the scan sequential digital circuit into its scan mode;

applying clock cycles at the slow clock speed to scan out through the primary outputs the logic value latched in the destination flip-flop; and comparing the logic value latched into the destination flip-flop with an expected logic value so as to determine whether a delay fault exists along the signal path of interest.

17. The method according to claim 16 further comprising the step of performing a backward path justification for said signal path of interest.

18. The method according to claim 16 wherein the reduced clock speed is half the speed of the rated clock speed.

19. The method according to claim 16 further comprising the step of checking whether said signal path of interest is sensitizable.

20. The method according to claim 16 wherein said signal path of interest includes combinational logic.

21. The method according to claim 16 wherein said another signal path includes combinational logic.

22. A method for detecting for delay faults in a scan sequential digital circuit having primary inputs, primary outputs and combinational logic connected between a plurality of flip-flops, said method comprising the steps of:

selecting a signal path of interest;

designating a source flip-flops proximate to a first end of the signal path of interest, a destination flip-flop proximate to a second end of the signal path of interest, and at least one initialization flip-flop extending to said source flip-flop along another signal path;

switching the scan sequential digital circuit into its scan mode;

scanning in at a slow clock speed state values to initialize the initialization flip-flop, and logic between the initialization flip-flop and the source flip-flop for the source flip-flop to propagate a desired signal transition to the destination flip-flop;

switching the scan sequential digital circuit into its functional mode;

applying a first test vector sequence to the primary input attempted at the rated clock speed so as to capture state values into the source flip-flop required to propagate said desired signal transition from said source flip-flop to said destination flip-flop;

applying a second test vector sequence to the primary input at the rated clock speed to propagate the desired signal transition to the destination flip-flop such that a logic value is latched therein;

switching the scan sequential digital circuit into its scan mode;

scanning out at the slow clock speed the logic value latched in the destination flip-flop; and comparing the logic value latched into the destination flip-flop with an expected logic value so as to determine whether a delay fault exists along the signal path of interest.

23. The method according to claim 22 further comprising the step of performing a backward path justification for said signal path of interest.

24. The method according to claim 22 wherein the reduced clock speed is half the speed of the rated clock speed of the circuit.

25. The method according to claim 22 further comprising the step of checking whether said signal path of interest is sensitizable.

26. The method according to claim 22 wherein said signal path of interest includes combinational logic.

27. The method according to claim 22 wherein said another signal path includes combinational logic.

* * * * *